United States Patent [19]
Johnson

[11] Patent Number: 5,172,123
[45] Date of Patent: Dec. 15, 1992

[54] FREQUENCY FEEDBACK LINEARIZER

[75] Inventor: Richard W. Johnson, Port Richey, Fla.

[73] Assignee: Hercules Defense Electronics, Inc., Clearwater, Fla.

[21] Appl. No.: 696,236

[22] Filed: Jan. 29, 1985

[51] Int. Cl.$^5$ .......................... G01S 13/32; G01S 7/40
[52] U.S. Cl. .................................... 342/200; 342/174; 331/4
[58] Field of Search ................. 343/14, 17.5; 331/178, 331/4; 342/122, 128, 200, 173, 174

[56] References Cited

U.S. PATENT DOCUMENTS

| | | | |
|---|---|---|---|
| 3,621,450 | 11/1971 | Blair et al. | 331/178 |
| 3,699,448 | 10/1972 | Martin et al. | 331/4 |
| 3,872,406 | 3/1975 | Grafinger | 331/4 |
| 4,038,612 | 7/1977 | Borofka et al. | 331/4 |
| 4,129,832 | 12/1978 | Neal et al. | 331/178 |
| 4,160,958 | 7/1979 | Mims et al. | 331/4 |
| 4,342,007 | 7/1982 | Elliot | 331/4 |
| 4,398,275 | 8/1983 | Zehner | 331/178 |
| 4,417,218 | 11/1983 | Berke | 331/178 |
| 4,468,638 | 8/1984 | Kyriakos | 331/4 |
| 4,499,435 | 2/1985 | Thompson et al. | 331/4 |
| 4,593,287 | 6/1986 | Nitardy | 343/17.5 |

Primary Examiner—Thomas H. Tarcza
Assistant Examiner—Mark Hellner
Attorney, Agent, or Firm—Dale R. Lovercheck

[57] ABSTRACT

Range resolution in an FMCW radar system is achieved by providing a periodic linear frequency sweep. The present invention assures the linearity of this sweep by using a negative feedback circuit which includes means for obtaining 16 sequential instantaneous frequency versus time slope measurements during each sweep cycle, generating a set of 16 sequential error signals and a corresponding set of correction voltages, and applying these correction voltages to the sweep drive voltage used to drive the voltage controlled oscillator that generates the frequency swept output signal.

3 Claims, 2 Drawing Sheets

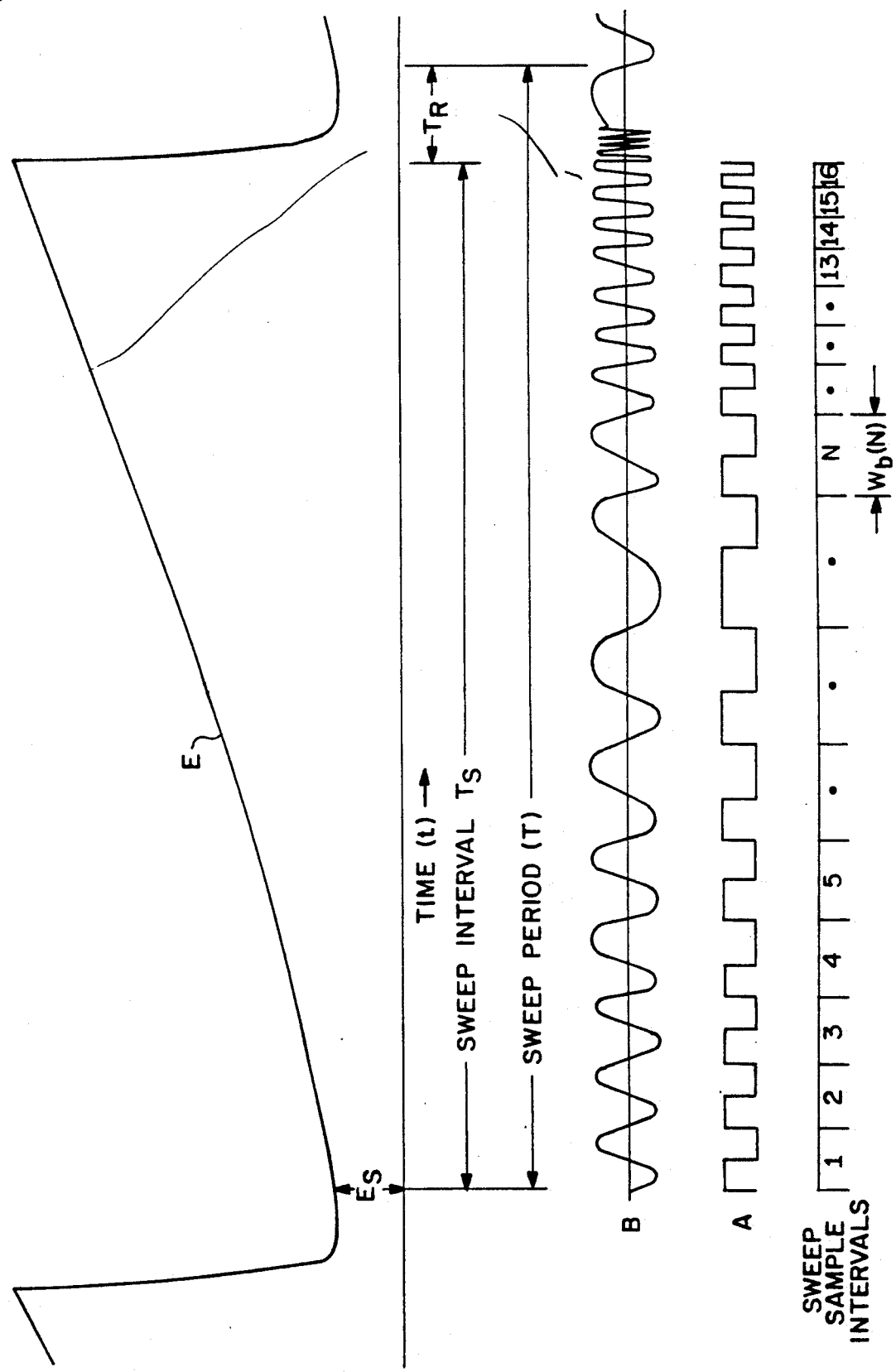

FREQUENCY FEEDBACK LINEARIZER

BACKGROUND OF THE INVENTION

1. Field of the Invention

The invention relates to frequency modulated, continuous wave radar systems, and more specifically to linear frequency sweep circuits for use in such radar systems.

2. Description of the Prior Art

Frequency modulated continuous wave (FMCW) radar systems require a source of linear periodic frequency sweep signals in order to achieve range resolution.

Typically the sweep circuits in such systems employ a voltage controlled oscillator (VCO) which is frequency turned by means of a drive voltage. Ordinarily the drive voltage is used to bias the VCO itself or to actuate a varactor diode installed in a microwave cavity associated with the VCO.

With either of the aforementioned tuning methods, the output frequency is a non-linear function of the drive voltage. Thus in order to provide a linear frequency sweep a non-linear drive compensation circuit or linearizer must be utilized. Typically, such linearizers comprise compensation means with as many as 15 adjustment potentiometers which are individually adjusted by a trial and error alignment procedure. In many instances, such compensation means are temperature sensitive so that the VCO had to be temperature-regulated. Furthermore since such linearization means are essentially open loop circuits, the compensation had to be continually re-adjusted to offset the effects of changing VCO or linearizer circuit properties, operating conditions, age and handling.

The present invention overcomes these shortcomings by employing a novel feedback system to overcome the effects of changing circuit parameters and operating environment.

SUMMARY OF THE INVENTION

The output of a VCO is monitored so as to obtain a set of individual sequential readings of frequency versus time slop errors for each sweep cycle of the VCO. These readings are used to generate a set of individual correction voltages which are sequentially applied to the VCO drive means so as to maintain a linear sweep frequency output.

BRIEF DESCRIPTION OF THE DRAWINGS

FIG. 2 is a graphical representation of signals occurring in the circuit of FIG. 1.

DESCRIPTION OF THE PREFERRED EMBODIMENT

Figure 1:
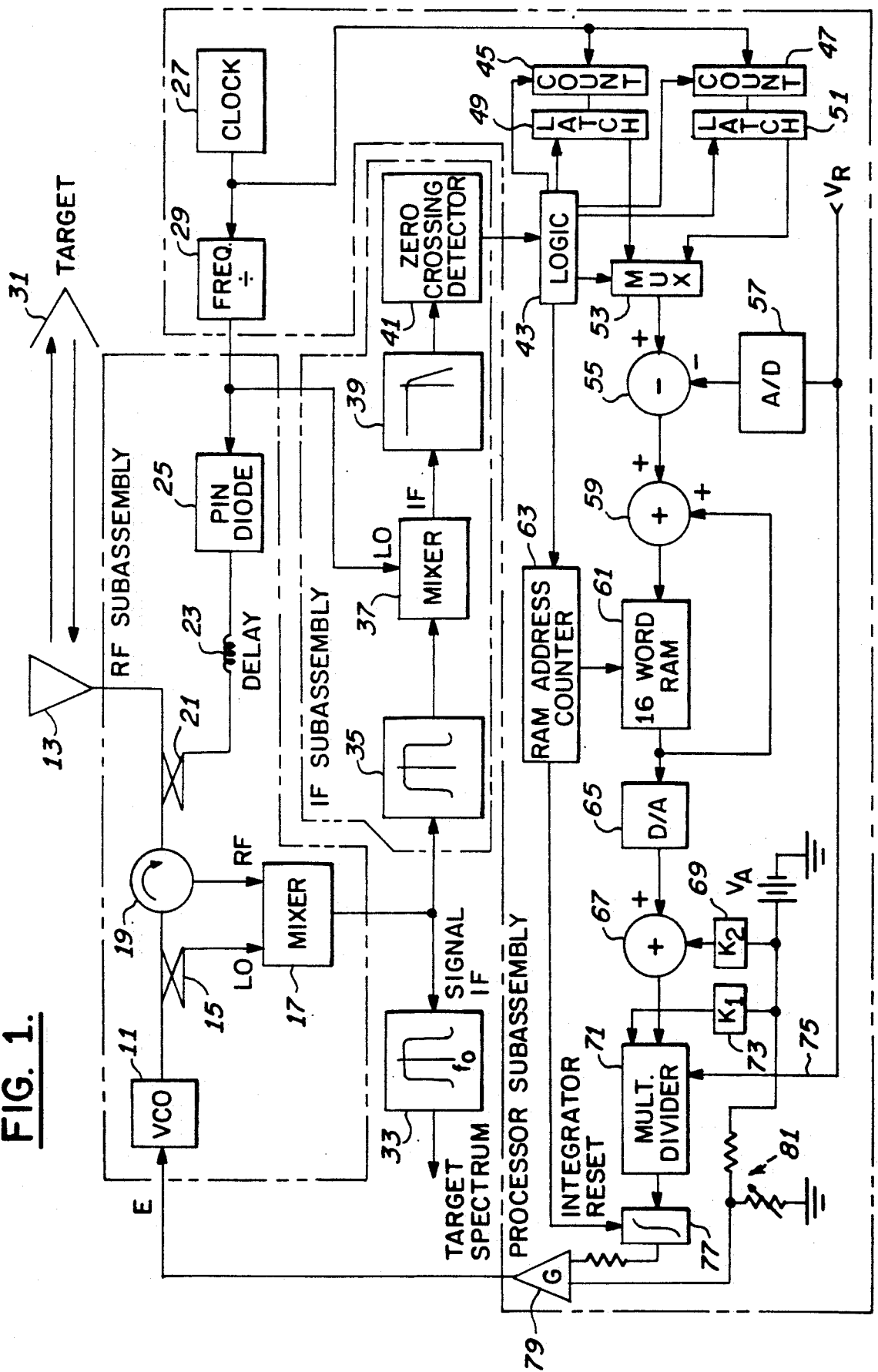
FIG. 1 is a block diagram illustrating a circuit constructed in accordance with the principles of the invention.

As illustrated in FIG. 1, a system employing the frequency feedback linearizer contains three subassemblies: an RF subassembly, an IF subassembly, and a processor subassembly.

The RF subassembly includes a VCO which provides the FMCW signal to be transmitted by the antenna 13. The output frequency of the VCO is determined by a sawtooth drive voltage E having, for example, a center frequency at 45 GHz and sweep range of 400 MHz.

The output signal from the VCO is applied through an RF coupler 15 to a mixer 17, to be described, and through a circulator 19 to the antenna 13. The coupler 15 typically provides an attenuation of 10 dB from the VCO 11 to the mixer 17.

A portion of the signal from the circulator is passed through a second RF coupler 21 to a delay line 23 which typically provides a 19 ns one way delay to each signal passing through the line. Signals emanating from the coupler 21 pass through the delay line to a known type of PIN diode modulator 25 where they are frequency modulated by signals generated by a clock 27 passing through a frequency divider 29. For a circuit having the parameters having previously mentioned, the clock may generate a 160 MHZ signal which is divided by four in the divider 29 to provide a 40 MHz double sideband suppressed carrier amplitude modulation to the signal from the delay line. The upper sideband of the modulated signal is reflected from the modulator 25 back to the delay line 23 and again delayed prior to being coupled, via RF coupler 21 and circulator 19, as one component of the RF input to the mixer 17. A second component of the RF input to the mixer 17 being the signal received from a target 31. Thus for the 19 ns delay line previously considered, the RF signal applied to the mixer represents the signal received from an external target as well as the output of the VCO delayed 38 ns is shifted upward 40 MHz. The output signal from the mixer 17, is coupled through bandpass filter 33 to extract the range delayed target signals and to a bandpass filter 35 to extract the time delayed signal emanating from the delay line 23. For a circuit including the 40 MHz modulating signal previously mentioned, a 40 MHz filter having a 10 MHz passband would be suitable for the extraction of the signal from the delay line. The output of the bandpass filter 35 is applied to a second mixer 37 where it is combined with the output signal from the frequency divider 29. The resulting IF signal is applied to a low pass filter 39, which may have a 5 MHz passband, to provide an output signal that represents the frequency difference between the VCO signal and the signal from the delay line. This output signal is representative of the frequency deviation of the VCO from the desired nominal value. The output of the filter 39 is applied to a zero crossing detector 41 which preferably consists of a comparator referenced to a small DC offset correction voltage at the non-inverting input to provide an output signal comprising a series of rectangular output pulses synchronized with the sinusoidal output signals from the filter 39.

If the output frequency of the VCO is represented as $w(t)$ in Hertz and the delayed VCO frequency is represented $w(t-\tau)$, where $\tau$ is the total two way delay line time delay, the resulting beat frequency $w(t)$ at the output terminal of filter 39 may be represented as:

$$w = w_b(t) - w(t-\tau) \quad (1)$$

This equation may be approximated as:

$$w_b(t) = \frac{dw(t)}{dt} \tau \quad (2)$$

FIG. 2 is a graphical representation of various above mentioned signals which might result from a non linear sweep frequency. The sweep drive voltage E occurs throughout a sweep period T and includes a sweep interval $T_S$ and a reset interval $T_R$. The sinusoidal beat signal B exhibits a variation in frequency because of the non linear sweep as will be discussed. The beat signal appears at the input to the zero crossing detector 41 which produces the rectangular pulse train A synchronized with the negative slope zero crossings of the sinusoidal beat signal train B. As will be explained, the pulse train A serves as a gating pulse train wherein the interval between vertically rising voltages in the rectangular pulse train define sweep sample intervals. As illustrated in FIG. 2, and as will also be explained, the sweep interval $T_S$ has been divided into 16 sweep sample intervals although more or fewer intervals could be used if desired.

The rectangular pulse train A from the zero crossing detector 41 is applied to a steering logic circuit 43 in the processor subassembly.

Basically, the function of the processor subassembly is to generate a seeep drive voltage to be applied to the VCO, measure the slope of the resulting VCO frequency sweep versus time curve a specified number of times during each sweep interval, generate an error sample corresponding to each slope measurement, generate individual correction voltages corresponding to each error sample, and to sequentially sum each correction voltage with the VCO sweep drive voltage so as to create a linear frequency sweep voltage at the output of the VCO.

Typically, the slope of the frequency versus time curve is sampled 16 times during each sweep cycle. For ease of understanding, this sampling frequency will be assumed in the following explanation.

Referring again to FIG. 1, the output of the clock 27, again assumed to be 160 MHz, is applied to first and second counters 45 and 47.

The steering logic 43 includes straightforward means for alternately enabling the counters 45 and 47 in response to successive rectangular gating pulses in the gating pulse train, and for temporarily holding the accumulated count in latching means 49 or 51 respectively. Either counter, when enabled, counts the number of cycles in the 160 MHz output of the clock 27 so that the count during a given sweep sample interval is an indication of the beat frequency occurring during that interval and thus an approximation of the non-linearity of the frequency sweep of the VCO output signal during the interval.

Effectively, the pair of counters are used to count the 160 MHz pulses during the odd and even sweep sample intervals, respectively.

By using a pair of counters and latches, the beat cycles during a given sweep may be determined separately and consecutively.

Information temporarily stored in the latches is transferred through a multiplexer 53 to a subtractor 55.

For purposes of explanation, assume that during sweep sample interval N (FIG. 2) counter 45 is enabled and counting. When interval N is terminated, interval N+1 immediately commences. At this time, the steering logic disables counter 45, enables counter 47, transfers the count from counter 45 to the latch 49 and transfers the stored information through the multiplexer 53 to the subtractor 55. At the termination of sweep sample interval N+1 the opposite operations take place and information accumulated in latch 51 is passed through the multiplexer to the subtractor 55.

Also applied to the subtractor 55 is a digitalized version of the range voltage $V_R$ conventionally generated by circuits in the radar system.

It will be appreciated by those skilled in the art that the range voltages used in radar systems of the type being considered are proportional to the sweep interval $T_S$.

As depicted in FIG. 1, the externally generated range voltage is digitalized in an analog/digital converter 57 and subtracted from the output signal of the multiplexer in subtractor 55.

The manner in which this portion of the linearizer operates may be understood by referring back to equation 2. For the Nth sweep sample interval, equation 2 may be written as:

$$\tau \frac{dw}{dt}(N) = w_b(N) \quad (3)$$

It will be recalled that the 160 MHz clock signal is gated into the counter means during each sweep sample interval for a length of time equal to the beat cycle and the accumulated count is passed on to subtractor 55. This count may be referred to as a phase count, $PC_N$, and written as:

$$PC_N = \frac{160 \times 10^6}{w_b(N)} \quad (4)$$

For a linear sweep frequency, the sweep sample intervals are uniform and equal to $(1/16)T_S$. The phase count for a linear sweep may therefore be written as:

$$PCL_N = 160 \times 10^6 \frac{T_S}{16} \quad (5)$$

Since the sweep interval, $T_S$, is proportional to the range voltage $V_R$, this voltage can be used to establish the sweep interval and hence $PCL_N$ via A/D converter 57.

The output of the subcontractor for the Nth sweep interval represents an error signal $\epsilon_N$ which is the difference between $PC_N$ and $PCL_N$. effect linearity of the VCO frequency sweep. The error signals are processed into a correction voltage sequence, then sammed with a predetermined sweep voltage to To better understand the error processing method employed in the invention, let the error associted with the Nth slope sample and the Mth sweep be $\epsilon_N(M)$. If this error were a constant with M and allowed to accumulate sweep after sweep, then its sum would approach infinity as M approaches infinity. In the present system, all 16 error signals are separately accumulated with each sweep, the system effectively comprises 16 separate integrators processing all 16 errors. The resulting 16 correction voltages then correct the sweep until each error signal becomes zero whereupon each frequency sweep slope sample has no error associated with it and a linear frequency sweep is achieved.

Referring again to FIG. 1, signals from the subtractor 55, $\epsilon_N(M)$, are applied to an adder 59 connected in an accumulator configuration utilizing a 16 word random access memory (RAM) 61 controlled in response to signals from a RAM address counter 63.

The counter 63 generates 16 sequential RAM addresses in response to steering signals from the steering logic 43 and applies these steering signals to the 16 word RAM 61.

The RAM 61 is driven by the steering logic 43 to be alternately read from and written into 16 times per sweep. The 16 words read from the RAM during sweep M are the 16 words that were written into the RAM during sweep M-1. The RAM 61 along with the steering logic 43 becomes a one sweep delay for each of the 16 RAM processed words.

If the Nth word read from the RAM during sweep M is designated as $Y_N(M)$ and this value is added to $\epsilon_N(M)$ from subtractor 55, the resulting output from the adder 59 becomes $Y_N(M+1)$.

This relationship may be stated as:

$$Y_N(M) + \epsilon_N(M) = Y_N(M+1) \quad (6).$$

Obtaining the Z transform of equation 6 and solving for $Y_N(z)$ yields:

$$Y_N = \frac{\epsilon_N(Z)z^{-1}}{1 - z^{-1}} \quad (7)$$

where $\epsilon_N = PC_N - PCL_N$.

Expanding equation 7 into an infinite series provides:

$$Y_N(Z) = \epsilon_N(Z)z^{-1} + \epsilon_N(z)z^{-2} + \ldots + \epsilon_N(Z)z^{M-d} + \ldots \quad (8).$$

Performing the inverse Z transform term by term yields:

$$Y_N(M) = \epsilon_N(M-1) + \epsilon_N(M-2) + \ldots + \epsilon_N(1) \quad (9).$$

From equation 9 it can been seen that $Y_N(M)$ is the desired summation of all prior errors associated with each prior sweep.

The $Y_N(M)$ RAM output is applied to a digital-/analog converter 65 which provides a correction voltage sequence $CORV_N$ needed to linearize the VCO frequency sweep. $CORV_N$ is thus the digital/analog converted value of $Y_N(M)$ as M is allowed to increase without limit.

The $CORV_N$ signals from the converter 65 are applied to the analog portion of the processor subassembly through an adder 67 which also is coupled to a reference voltage source $V_A$ through a voltage adjustment means 69. The output of the adder 67 is applied to a multiplier/divider 71.

A second voltage obtained from the reference source $V_A$ is passed through a second voltage adjustment means 73.

The range voltage $V_R$ is also coupled to the multiplier/divider through a line 75. The multiplier is connected so as to multiply the voltage from the adder 67 by the voltage from the voltage adjustment means 73 and to divide the resultant product by the range voltage $V_R$. The output of the multiplier/divider is integrated in an integrator 77 and coupled to an amplifier 79 having a gain G.

The reference voltage source $V_A$ is also coupled to the amplifier 79 through a variable resistance network 81 which serves to establish the voltage level $E_s$ at the beginning of the sweep as depicted in FIG. 2.

A sweep is terminated when an integrator reset pulse is applied to the integrator 77 from the RAM address counter 63. It will be recalled that this counter is programmed to provide a series of 16 address commands to the RAM 61 during each sweep cycle. The address counter is further programmed to provide a reset signal to the integrator in response to the 17th negative zero crossing detected by the zero crossing detector 41.

To aid in understanding the operation of the analog portion of the processor subassembly, assume first that the correction voltage $CORV_N$ at the output of the digital/analog converter 65 is zero. Representing the modified $V_A$ voltages applied to the adder 67 and the multiplier/divider 71 from the source $V_A$ as $K_2V_A$ and $K_1V_A$, respectively, it can be seen that the input to the integrator is $K_2K_1V_A^2/V_R$. Under these conditions the output from the VCO drive amplifier 79 becomes:

$$E(t) = E_s + \frac{K_1K_2V_A^2G}{V_R RC} \int_o^t dt \quad (10)$$

where RC represents the resistance-capacitance elements in the integrator and G is the gain of the amplifier 79.

Equation (10) represents the uncorrected sweep drive voltage and is seen to be a ramp whose slope is scaled by the reciprocal of $V_R$. The scale factor $K_1K_2V_A^2G/RC$ is selected such that equation (10) integrates to the end of the sweep voltage or that voltage in FIG. (2) defined by E at a time $T_S$ where $T_S$ is determined by equation (5) and where $PCL_N$ in equation (5) is determined by $V_R$ after digital conversion via A/D (57).

The number of sample intervals, N, is determined from sweep frequency end points and not time as can be demonstrated by integration of equation (2). Again recalling that $w_b$ is in Hertz and not radians per second:

$$N = \int_T^T \omega_b(t)dt \approx \quad (11)$$

$$\int_T^{T_s} \tau \frac{d\omega}{dt} dt = \int_T^{T_s} \tau d\omega = \tau[\omega(T_s) - \omega(\tau)]$$

When a finite correction voltage $CORV_N$ occurs at the input to the adder 67, this voltage becomes scaled by the reciprocal of $V_R$ so that $CORV_N$ always integrates to the same voltage adjustment at the VCO regardless of sweep period.

The $CORV_N$ produces a drive voltage component $E(CORV_N)$ at the input to the VCO which is given by:

$$E(CORV_N) = \frac{K_1 V_A G}{RC} \int_o^t \frac{CORV_N}{V_R} dt \quad (12)$$

where N is an integer and related to time as shown in FIG. 2.

Since $T_S$ is proportional to $V_R$ and since each sample interval is $T_S/16$ in steady state, equation 12 can be written for steady state conditions as:

$$\frac{E(CORV_N)}{K} = \int_o^{T_s/16} \frac{CORV_1}{T_s} dt + \quad (13)$$

$$\int_{T_s/16}^{2T_s/16} \frac{CORV_2}{T_s} dt + \ldots + \int_{\frac{(N-1)T_s}{16}}^t \frac{CORV_N}{T_s} dt$$

where K is a constant of proportionality. This may be simplified and rewritten as:

$$\frac{E(CORV_N)}{K} = \frac{CORV_1}{16} + \frac{CORV_2}{16} + \cdots + \int_{(N-1)T_s}^{t} \frac{CORV_N}{16} dt \quad (14)$$

where $$\frac{(N-1)}{16} T_s < t \leq \frac{NT_s}{16}.$$

The integrated terms of equation (14) are proportional to the actual time sequential voltage corrections necessary to correct the VCO tuning characteristic for linear frequency sweep at discrete points. They are not explicitly functions of $T_S$. They are also not implicitly strong functions of $T_S$. With this frequency feedback linearizer the point by point voltage modification, to a VCO tuning characteristic, for linear frequency sweep, is not strongly influenced by sweep rate. This means that scaling $CORV_N$ by the reciprocal of $V_R$ has rendered $CORV_N$ in equation (14) invarient to sweep rate. In other words, $CORV_N$ is essentially the same for all sweep rates. The only limitation on this is the accuracy of the multiplier divider 71, which does the actual scaling, and the weak possible dependence of the GDO tuning characteristic on sweep rate. Stray Capacitance probably accounts for this dependence.

For these above reasons, reciprocal sealing by $V_R$ allows the feedback loop to be opened for linearizer operation once a converged upon set of $CORV_N$ has been arrived at. This is called "freezing" and is implemented in the hardware by suppression of the RAM write command. The RAM is then only read for its previously arrived at correction sequence $Y_N$. Freezing may be done for short periods of time and over a moderate range of range voltage.

It will be appreciated that the various frequencies mentioned in the foregoing description as well as the number of sample intervals in a given sweep are a matter of choice in design. Variations from these specific values can be made if so desired.

In some instances, it may be desired to increase the noise immunity and stability of the system. This can be accomplished by reducing the accumulator gain however this would result in a loss of resolution and system accuracy. These problems can be overcome by providing greater word length or larger bit capacity than required for the designated $PC_N(M)$ and $PCL_N(M)$ quantities.

Thus in the error processor previously described, the subtractor 55, the adder 59 and the RAM 61 could be modified to a capacity of k bits while the input words $PC_N(M)$ and $PCL_N$ remain j bits long, where k and j are integers and k is greater than j. Furthermore, it should be noted that these input words are always positive 2's complement numbers. To implement this embodiment, the lower input bit positions of the subtractor (l through j) would be reserved for the input words $PC_N(M)$ and $PCL_N$ whereas the upper unused bit positions (J+1 through k) would be made to be zero. The output of the subtractor then becomes:

$$\epsilon_N(M) = \frac{1}{2^{K-J}} [PC_N(M) - PCL_N] \quad (15)$$

Thus this version of the error processor affects an attenuation of the error by $2^{K-J}$ so as to increase the noise immunity without loss of resolution. The D/A converter 65 may remain a j bit size device. For connection it must be connected to bits $(K-j_l)$ through K of the RAM 61 in order to take advantage of the attenuation shown in equation 15 without loss of resolution.

While the invention has been described in its preferred embodiments, it is to be understood that the words which have been used are words of description rather than of limitation and that changes within the purview of the appended claims may be made without departure from the true scope and spirit of the invention in its broader aspects.

I claim:

1. A circuit for linearizing rate of change of frequency in a periodic frequency swept signal generated by a voltage controlled oscillator including,
   means coupled to said voltage controlled oscillator for providing sweep drive voltages,
   means for sampling said frequency swept signal to provide a sample signal,
   means having input and output means coupled to receive said sample signal for providing a time delayed signal representative of said sample signal,
   means coupled to said output means for modulating said time delayed signal with a signal at a predetermined frequency and reflecting a time delayed modulated signal to said output means, such that a twice time delayed signal representative of said modulated signal is coupled to said input means,
   means coupled to said input means and to said voltage controlled oscillator for mixing said frequency swept signal and said twice time delayed signal to obtain a beat signal characteristic of instantaneous frequency differences between said frequency swept signal and said twice time delayed signal,
   means coupled to said mixing means and responsive to said beat signal for providing a sequence of gate signals to establish N sequential sample intervals within each frequency sweep, each gate signal representative of a corresponding cycle of said beat signal and existing for a time period equal to said corresponding cycle duration,
   means coupled to said gate signals means and said voltage controlled oscillator for generating a slope error signal during each sample interval representative of said rate of change of frequency,
   means coupled to said slope error signal generating means for generating a slope error correction signal for each slope error signal, and
   means coupled to said error signal generating means and said sweep drive means for combining said slope error correction signal in corresponding sample intervals in each sweep of said sweep drive voltages to produce a correction signal to linearize said rate of change of frequency.

2. The linearizing circuit of claim 1 wherein said slope error signal means includes means for providing clock signals at a constant frequency, first and second counters coupled to said clock means for counting clock signals, steering logic means responsive to said gate signals for alternately enabling said first and second counters during successive sample intervals, first and second latching means respectively coupled to said first and second counters and to said steering logic means for storing accumulated counts of said first and second counters, and multiplexing means coupled to said first and second latching means for receiving information stored in one latch when said counter coupled to said latch other than said one latch is enabled.

3. The linearizing circuit of claim 1 wherein said mixing means includes
first mixing means coupled to said voltage controlled oscillator and to said input means for providing said signals having intermediate frequencies equal to said predetermined frequency, and
second mixing coupled to said first mixing means, to said modulating means, and to said gate means for providing said beat signals to said gate signals means.

* * * * *